United States Patent [19]

Ballance et al.

[11] Patent Number: 5,145,723
[45] Date of Patent: Sep. 8, 1992

[54] PROCESS FOR COATING A SUBSTRATE WITH SILICA

[75] Inventors: David S. Ballance; Robert C. Camilletti; Theresa E. Gentle, all of Midland, Mich.

[73] Assignee: Dow Corning Corporation, Midland, Mich.

[21] Appl. No.: 710,627

[22] Filed: Jun. 5, 1991

[51] Int. Cl.⁵ .............................................. B05D 3/02
[52] U.S. Cl. .......................... 427/397.7; 106/287.12; 106/287.13; 106/287.16; 252/378 R; 427/341; 427/387
[58] Field of Search .................. 427/341, 387, 397.7, 427/340; 423/335; 106/287.12, 287.13, 287.16, 287.34; 252/378 R

[56] References Cited

U.S. PATENT DOCUMENTS 4,708,945  11/1987  Murrell et al. ................. 502/263
4,749,631  6/1988  Haluska et al. ................. 427/397.7
4,756,977  7/1988  Haluska et al. ................. 428/704

FOREIGN PATENT DOCUMENTS 1174755  12/1969  United Kingdom ............... 423/335

OTHER PUBLICATIONS

Accuglass ® Product Literature, Allied Chemical Co. (undated).

*Primary Examiner*—Shrive Beck
*Assistant Examiner*—Terry J. Owens
*Attorney, Agent, or Firm*—Roger E. Gobrogge

[57] ABSTRACT

To form a coating of silica on a substrate, the substrate is coated with a silica precursor having a melting point between about 50° and about 450° C. The coating is heated to a temperature above its melting point in an inert environment to allow the coating to melt and flow. The melted coating is then heated in an environment which facilitates conversion to silica for a time sufficient to convert it to silica.

10 Claims, 2 Drawing Sheets

PROCESS FOR COATING A SUBSTRATE WITH SILICA

BACKGROUND OF THE INVENTION

The present invention relates to a method of forming a silica coating on a substrate. The method comprises applying a silica precursor coating to the substrate and heating it to a temperature above its melting point in an inert environment. The melted coating is then heated in an environment which facilitates conversion to silica for a time sufficient to convert it to silica.

The use of ceramic coatings for their protective and dielectric effect is known in the electronics art. For instance, Haluska et al. in U.S. Pat. No. 4,756,977 disclose silica coatings produced by applying a solution of hydrogen silsesquioxane resin to an electronic device and then ceramifying by heating in air at temperatures of 200°–1000° C. The ceramic coatings produced thereby have many desirable characteristics such as microhardness, moisture resistance, high adhesion, etc.

Similarly, the Accuglass TM product literature teaches the use of silicon-oxygen backbone polymers in forming coatings which are useful in microelectronic device processing. This reference describes applying a coating solution comprising the polymer and a solvent followed by consecutive curing of the polymer in air and nitrogen.

Haluska, in U.S. patent application Ser. No. 07/683,908, also describes applying a silicon-containing coating to a substrate. The method taught therein comprises coating the substrate with a solution comprising a solvent and one or more preceramic materials. The preceramic material is then ceramified by heating at temperatures in the range of about 500° to about 1000° C. under an inert gas atmosphere.

The present inventors have now discovered that sequential heating first in an inert environment and then in a reactive environment which facilitates conversion to silica produces coatings having improved planarity and reduced cracks in comparison to conventionally formed silica coatings.

SUMMARY OF THE INVENTION

The present invention relates to a method of forming a silica coating on a substrate. The method comprises forming a preceramic coating comprising a silica precursor having a melting point between about 50° and about 450° C. on the substrate. The preceramic coating is then heated above the melting point of the silica precursor in an inert environment for a time sufficient to allow the coating to flow yet insufficient to allow the coating to ceramify. The melted coating is then heated in an environment which facilitates conversion to silica for a time sufficient to convert the melted preceramic coating to silica.

DETAILED DESCRIPTION OF THE INVENTION

Figure 1:
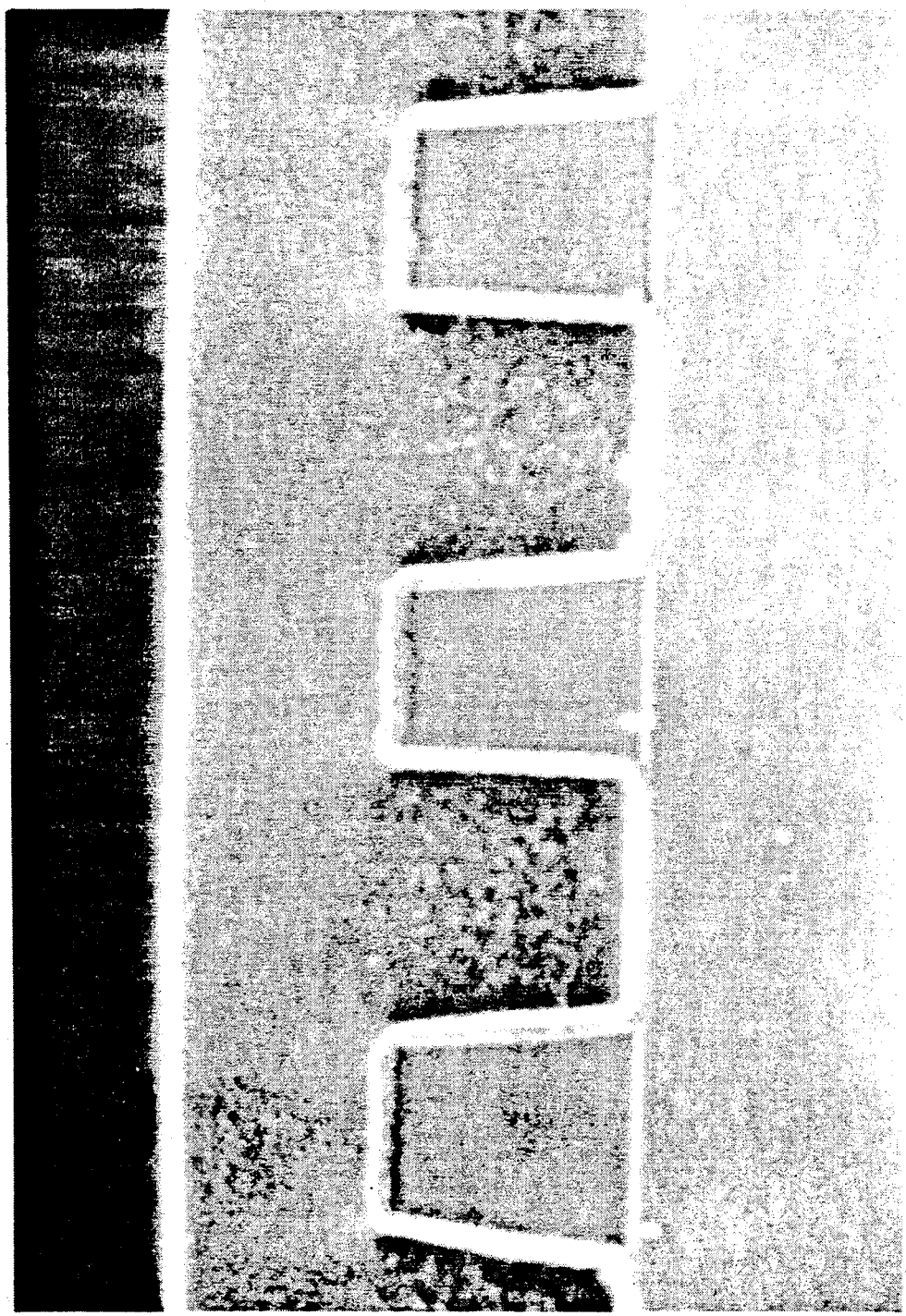
FIG. 1 is a photograph of a patterned silicon wafer coated by the process of the present invention.

The present invention is based on the discovery that silica precursors having melting points between about 50° and about 450° C. will reproducibly melt and flow under an inert environment prior to ceramification. This discovery is used in this invention to cause the silica precursor to controllably melt and evenly flow across the surface of a substrate prior to its conversion to silica. This process is particularly advantageous over the prior art which suggest heating the coating in an oxidizing environment since such a process results in either no or vary erratic flow due to the simultaneous initiation of melting along with oxidation and crosslinking in the coating. Similarly, this process is also advantageous over the prior art which completes the conversion of the precursor to silica entirely in an inert environment since high temperatures are often necessary in such a process. The sequential use of an inert environment and an oxidative environment as described herein thus allows for desirable flow characteristics and low temperature ceramification.

The coatings taught herein are useful as protective and dielectric layers on a variety of substrates. For instance, the planarizing and dielectric properties of these coatings make them ideally suited for use on electronic devices as interlevel dielectrics in multilayered devices. Similarly, the high density and low defect rate of these coatings makes them useful for protecting electronic devices from environmental contaminants such as moisture and ionic impurities.

Despite the specific applications set forth above, however, it is contemplated that the coatings taught herein can be used on any substrate requiring such a coating. Moreover, the choice of such substrates and devices is limited only by the need for thermal and chemical stability of the substrate at the temperature and in the environment utilized in the present invention.

As used in the present invention, the expression "silica" refers to those pyrolyzed materials containing Si—O—Si bonds which may or may not be fully free of residual Si—C, Si—H, Si—OH, and/or Si—OC but which are otherwise ceramic in character; the expression "planarizing coating" refers to a coating which is less irregular than the surface prior to application of the coating: and the expressions "electronic device" or "electronic circuit" include, but are not limited to silicon based devices gallium arsenide based devices, focal plane arrays, opto-electronic devices, photovoltaic cells and optical devices. Specific examples of such devices include transistor-like devices, capacitor and capacitor-like devices, multilayer devices, 3-D devices, silicon on insulator devices, super lattice devices and the like.

The silica coatings taught herein are produced by a process which comprises applying a preceramic coating comprising a silica precursor having a melting point between about 50° and about 450° C. to the substrate. The preceramic coating is then heated above the melting point of the silica precursor in an inert environment for a time sufficient to allow the coating to flow but at a temperature and for a time insufficient to cause the coating to ceramify. The melted coating is then heated in an environment which facilitates conversion to silica for a time and at a temperature sufficient to convert the melted preceramic coating to silica.

The silica precursor materials which are useful herein are any which have a melting point between about 50° and about 450° C. under an inert atmosphere and which can be converted to silica at temperatures less than about 1000° C. Examples of such materials include hydridosilane resins, hydrolyzed or partially hydrolyzed $R_xSi(OR)_{4-x}$, wherein R is independently selected from the group consisting of alkyl, aryl and unsaturated hydrocarbons and x is 0-2, and conventional spin on-glasses such as those produced by Allied Chemical and marketed under the trade name Accuglass ™. Preferred herein, however, is the use of the hydridosilane resins with the use of hydrogen silsesquioxane resin being particularly preferred.

The term hydrogen silsesquioxane resin or H-resin is used in this application to describe various hydridosilane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Though not represented by this structure, these resins may contain a small number of silicon atoms which have either 0 or 2 hydrogen atoms attached thereto due to various factors involved in their formation or handling.

The above hydridosilane resins are generally produced by a process comprising the hydrolysis and condensation of silanes of the formula $HSiX_3$, wherein X is a hydrolyzable group. These reactions may result in a fully condensed $(HSiO_{3/2})_n$ resin or the hydrolysis and/or condensation may be interrupted at an intermediate point such that partial hydrolyzates (containing Si—OR groups) and/or partial condensates (containing SiOH groups) are formed. Such methods include that of Collins et al. in U.S. Pat. No. 3,615,272, which is incorporated herein by reference. It is described therein that a nearly fully condensed H-resin (which may contain up to 100-300 ppm silanol) can be produced by hydrolyzing trichlorosilane in a benzenesulfonic acid hydrate hydrolysis medium and then washing the resultant resin with water or aqueous sulfuric acid. Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent. A preferred embodiment of this latter process uses an acid to silane ratio of about 6/1.

Other resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Pat. Nos. 59-178749, 60-86017 and 63-107122, or any other equivalent hydridosilane, are also functional herein.

The desired silica precursor is first applied to the substrate to form a preceramic coating. Although any conventional technique may be used, it is particularly preferred to coat the substrate with a solution comprising a solvent and the silica precursor. Removal of the solvent by evaporation or a similar technique yields the preceramic coating. Other equivalent methods, however, are also contemplated herein. In an alternative embodiment of this invention, the silica precursor may be applied to the substrate in an inert environment to prevent early cross-linking of the polymer.

If the above solution method is used, the silica precursor is first dissolved in a solvent. Various facilitating measures such as stirring and/or heating may be used to aid in the dissolution. Solvents which may be used include any which will dissolve the silica precursor to form a solution or suspension without affecting the coating. These solvents can include, for example, alcohols such as ethyl or isopropyl, aromatic hydrocarbons such as benzene or toluene, alkanes such as n-heptane or dodecane, ketones, esters, glycol ethers, or cyclic dimethylpolysiloxanes, in an amount sufficient to dissolve the above materials to low solids. Generally, enough of the above solvent is used to form a 0.1-50 weight percent solution.

If a hydridosilane resin is used in the coating solution, a platinum, rhodium or copper catalyst may also be added herein to increase the rate and extent of conversion to silica. Generally, any platinum, rhodium or copper compound or complex which can be solubilized will be functional. For instance, an composition such as platinum acetylacetonate, rhodium catalyst $RhCl_3[S(CH_2CH_2CH_2CH_3)_1]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydridosilane.

If the above solution method is used, the coating solution is applied by techniques such as spin coating, dip coating, spray coating or flow coating. Evaporation of the solvent by any suitable means such as simple air drying by exposure to an ambient environment or by the application of a vacuum or mild heat yields the desired preceramic coating. As noted, an alternative embodiment of this invention comprises coating the substrate with the silica precursor in an inert environment to prevent early cross-linking of the polymer.

The resultant preceramic coating is then heated above the melting point of the silica precursor in an inert environment for a time sufficient to allow the coating to flow but at a temperature and for a time insufficient to cause the coating to ceramify. The expression "melting point" is used herein to describe that temperature at which an amorphous solid is converted to a viscoelastic resin which will flow across the surface of the substrate. This process allows the silica precursor to evenly distribute on the surface of the substrate and planarize any uneven topography. In addition, it allows the surface of the substrate to be sealed and assists in healing and/or preventing pinholes, cracks or other surface anomalies.

Generally, any inert environment which does not react with the coating can be used during this heating step. For instance, environments comprising argon, helium or nitrogen are all functional herein. Similarly, the use of vacuum will also provide the necessary environment for flow.

The temperature used during this step should be one which melts the silica precursor without initiating ceramification during the required flow time. Temperatures in the range of about 50° to about 450° C. are generally sufficient. If hydrogen silsesquioxane resin is used as the silica precursor, temperatures of about 150° to about 400° C. are generally functional.

The heating time necessary during this step should be one which allows the resin to flow and yet does not initiate ceramification at the chosen temperature. Generally, this time can vary from a fraction of a second to several hours. For practical reasons, it is preferred that the time be less than about 1 hour and more preferred that the time be less than about 15 minutes.

After the resin has melted and flowed, the environment is altered to facilitate conversion of the melted silica precursor to silica. Reactive environments such as those comprising air, $O_2$, oxygen plasma, ammonia, amines, etc. may be used. It is especially preferred, however, to heat under a wet ammonia atmosphere to hydrolyze the Si—H bonds and then under a dry ammonia atmosphere to effect removal of any remaining Si—OH groups.

The melted preceramic coating is subjected to such reactive environments at a temperature sufficient for ceramification. Generally, this temperature is about 20° to about 1000° C. depending on the reactive atmosphere. Preferred temperatures are in the range of about 50° to about 800° C. Higher temperatures usually result in quicker and more complete ceramification, but said temperatures also may have detrimental effects on various temperature sensitive substrates. For temperature sensitive substrates, temperatures in the range of about 100° to about 400° C. are often preferred. The preceramic coatings are usually subjected to these temperatures for a time sufficient to ceramify the coating, generally up to about 6 hours, with a range of up to about 2 hours being preferred.

Any source of heat such as a hot plate, a convection oven, rapid thermal processing, or radiant or microwave energy can be used during either pyrolysis step.

By the above methods a silica planarizing coating is produced on the substrate. The coating smooths the irregular surfaces of various substrates and has excellent adhesion. This coating may also be covered by other coatings such as further $SiO_2$ coatings. $SiO_2$/modifying ceramic oxide layers, silicon containing coatings, silicon carbon containing coatings, silicon nitrogen containing coatings, silicon nitrogen carbon containing coatings and/or diamond like carbon coatings. Such multilayer coatings are taught in U.S. Pat. No. 4,973,526, which is incorporated herein by reference.

EXAMPLE 1

Patterned silicon wafers were coated with 6 mL of a 25 weight percent solution of hydrogen silsesquioxane resin in methyl isobutyl ketone and spun at 2000 rpm for 10 seconds in air. The coated wafers were then placed in a nitrogen environment and heated on a hot plate at 150° C. for 1 minute, 200° C. for 1 minute and 300° C. for 1 minute. The wafers with the melted coating were then heated by rapid thermal processing in oxygen at 400° C. for 10 minutes.

Figure 2:
FIG. 2 is a photograph of a patterned silicon wafer coated by a prior art process.

The resultant coating was a completely planar silica coating as shown in FIG. 1. By contrast, FIG. 2 shows a cross-section of a commercially available device coated with Accuglass™ spin-on glass and processed according to the instructions provided in the product literature. It is evident that the process of the present invention provides a more planar surface.

That which is claimed is:

1. A method of forming a silica coating on a substrate comprising:
   forming a coating on a substrate where the coating comprises a silica precursor having a melting point between about 50° and about 450° C.;
   heating the coating to a temperature above the melting point of the silica precursor in an inert environment for a time sufficient to allow the coating to flow; and
   after the coating has flowed, exposing the coating to a reactive environment for a time and at a temperature sufficient to convert the coating to silica.

2. The method of claim 1 wherein the coating is formed by a method comprising dissolving the silica precursor in a solvent to form a solution, coating the substrate with the solution and evaporating the solvent.

3. The method of claim 2 wherein the solvent is selected from the group consisting of alcohols, aromatic hydrocarbons, alkanes, ketones, esters, glycol ethers, and cyclic dimethylpolysiloxanes and the solvent is present in an amount sufficient to dissolve the silica precursor to a 0.1–50 weight percent solution.

4. The method of claim 2 wherein the solution is applied to the substrate and the solvent evaporated in an inert environment.

5. The method of claim 1 wherein the silica precursor comprises hydrogen silsesquioxane resin.

6. The method of claim 4 wherein the silica precursor comprises hydrogen silsesquioxane resin.

7. The method of claim 1 wherein the reactive environment is selected from the group consisting of air, oxygen, oxygen plasma, ammonia and amines.

8. The method of claim 1 wherein the coating is exposed to the reactive environment at a temperature between about 50° and about 800° C.

9. The method of claim 1 wherein the coating is heated in the inert environment at a temperature in the range of about 50° to about 450° C. for a time of less than about 15 minutes to allow the coating to flow.

10. The method of claim 1 wherein the inert environment is selected from the group consisting of argon, helium, nitrogen and vacuum.

* * * * *